United States Patent
Mao et al.

(10) Patent No.: US 9,425,062 B2
(45) Date of Patent: Aug. 23, 2016

(54) METHOD FOR IMPROVING CD MICRO-LOADING IN PHOTOMASK PLASMA ETCHING

(71) Applicant: Applied Materials, Inc., Santa Clara, CA (US)

(72) Inventors: Zhigang Mao, San Jose, CA (US); Xiaoyi Chen, Foster City, CA (US); Amitabh Sabharwal, San Jose, CA (US); Ajay Kumar, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/198,568

(22) Filed: Mar. 5, 2014

(65) Prior Publication Data
US 2014/0273490 A1 Sep. 18, 2014

Related U.S. Application Data

(60) Provisional application No. 61/783,643, filed on Mar. 14, 2013.

(51) Int. Cl.
| | |
|---|---|
| H01L 21/3065 | (2006.01) |
| H01L 21/3213 | (2006.01) |
| G03F 1/54 | (2012.01) |
| G03F 1/80 | (2012.01) |
| H01L 21/033 | (2006.01) |
| H01L 21/67 | (2006.01) |
| G03F 1/00 | (2012.01) |
| C23F 4/00 | (2006.01) |
| H01L 21/311 | (2006.01) |

(52) U.S. Cl.
CPC .......... *H01L 21/32136* (2013.01); *C23F 4/00* (2013.01); *G03F 1/00* (2013.01); *G03F 1/54* (2013.01); *G03F 1/80* (2013.01); *H01L 21/0338* (2013.01); *H01L 21/3065* (2013.01); *H01L 21/32139* (2013.01); *H01L 21/67069* (2013.01); *H01L 21/31122* (2013.01)

(58) Field of Classification Search
None
See application file for complete search history.

(56) References Cited

U.S. PATENT DOCUMENTS 5,480,051 A * 1/1996 Hain .................. C23F 4/00 216/67
2010/0176087 A1* 7/2010 Igarashi et al. ............. 216/79

OTHER PUBLICATIONS

M.J. Buie et al., "Chrome Etch for <0.13um Advanced Reticle Production", Proceedings of SPIE, vol. 4562, year 2002, pp. 633-640.*
H. Xiao, Introduction to Semiconductor Manufacturing Technology, published by Prentice Hall, year 2001, ISBN 0-13-022404-9, pp. 354-355.*

* cited by examiner

*Primary Examiner* — Jiong-Ping Lu
(74) *Attorney, Agent, or Firm* — Patterson & Sheridan, LLP

(57) ABSTRACT

Embodiments of the present invention provides methods to etching a mask layer, e.g., an absorber layer, disposed in a film stack for manufacturing a photomask in EUV applications and phase shift and binary photomask applications. In one embodiment, a method of etching an absorber layer disposed on a photomask includes transferring a film stack into an etching chamber, the film stack having a chromium containing layer partially exposed through a patterned photoresist layer, providing an etching gas mixture including $Cl_2$, $O_2$ and at least one hydrocarbon gas in to a processing chamber, wherein the $Cl_2$ and $O_2$ is supplied at a $Cl_2:O_2$ ratio greater than about 9, supplying a RF source power to form a plasma from the etching gas mixture, and etching the chromium containing layer through the patterned photoresist layer in the presence of the plasma.

8 Claims, 5 Drawing Sheets

METHOD FOR IMPROVING CD MICRO-LOADING IN PHOTOMASK PLASMA ETCHING

CROSS-REFERENCE TO RELATED APPLICATIONS

This application claims benefit of U.S. Provisional Application Ser. No. 61/783,643 filed Mar. 14, 2013, which is incorporated by reference in its entirety.

BACKGROUND

1. Field

Embodiments of the present invention generally relate to a method for improving critical dimension (CD) microloading in plasma etching a mask layer and, more specifically, to a method for etching a mask layer (e.g., an absorber layer) for both phase shift and binary photomask fabrication and EUV photomask fabrication.

2. Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

A photomask is typically a glass or a quartz substrate giving a film stack having multiple layers, including an absorber layer, capping layer and a photomask shift mask layer disposed thereon. When manufacturing the photomask layer, a photoresist layer is typically disposed on the film stack to facilitate transferring features into the film stack during the subsequently patterning processes. During the patterning process, the circuit design is written onto the photomask by exposing portions of the photoresist to extreme ultraviolet light or ultraviolet light, making the exposed portions soluble in a developing solution. The soluble portion of the resist is then removed, allowing the exposed underlying film stack being etched. The etch process removes the film stack from the photomask at locations where the resist was removed, i.e., the exposed film stack is removed.

With the shrink of critical dimensions (CD), present optical lithography is approaching a technological limit at the 45 nanometer (nm) technology node with small features. Next generation lithography (NGL) is expected to replace the conventional optical lithography method, for example, in the 32 nm technology node and beyond. There are several NGL candidates, such as extreme ultraviolet (EUV) lithography (EUVL), electron projection lithography (EPL), ion projection lithography (IPL), nano-imprint, and X-ray lithography. Among these, EUVL is the most likely successor due to the fact that EUVL has most of the properties of optical lithography, which is more mature technology as compared with other NGL methods.

One of the problems in patterning features with small dimension features is the occurrence of a microloading effect, which is a measure of the variation in etch dimensions between regions of high and low feature density. The low feature density regions (e.g., isolated regions) receive more reactive etchants per unit surface area compared to the high feature density regions (e.g., dense regions) due to larger total expose of surface area in the dense regions, thereby resulting in a higher etching rate in the low density regions. The sidewall passivation generated from the etch by-products exhibited the similar pattern density dependence where more passivation is formed for the isolated features due to more by-products being generated in the low feature density region. The difference in reactive etchants and the passivation per surface area between these two regions increase as feature density difference increase. Thus, due to different etch rates and by-products formation in high and low feature density regions, it is often observed that while the low feature density regions have been etched and defined in a certain desired and controlled vertical dimension, the high feature density regions are bowed and/or undercut by the lateral attacking due to the insufficient sidewall passivation or insufficient etching selectivity of the adjacent layers disposed in the film stack to sustain the film stack until completion of the etching process. In many cases, the low feature density regions are often etched at a faster rate than the high feature density regions, resulting in a deformation, line edge roughness or tapered top portion of the etched layer in the low feature density regions. Insufficient selectivity among the material layers disposed in the film stack in high and low feature density regions often results in inability to hold critical dimension of the etch features and poor patterned transfer.

Thus, there is a need for an improved etch process for etching an absorber layer in a film stack utilized to form a photomask with high etching selectivity.

SUMMARY

Embodiments of the present invention provides methods to etching a mask layer, e.g., an absorber layer, disposed in a film stack for manufacturing a photomask in EUV applications and phase shift and binary photomask applications. In one embodiment, a method of etching an absorber layer disposed on a photomask includes transferring a film stack into an etching chamber, the film stack having a chromium containing layer partially exposed through a patterned photoresist layer, providing an etching gas mixture including $Cl_2$, $O_2$ and at least one hydrocarbon gas into a processing chamber, wherein the $Cl_2$ and $O_2$ is supplied at a ratio greater than about 9, supplying a RF source power to form a plasma from the etching gas mixture, and etching the chromium containing layer through the patterned photoresist layer in the presence of the plasma.

In another embodiment, a method of etching an absorber layer disposed on a photomask includes transferring a film stack into an etching chamber, the film stack having an absorber layer partially exposed through a patterned photoresist layer, wherein the absorber layer is a tantalum containing layer, providing an etching gas mixture including at least a fluorine containing gas and at least one hydrocarbon gas into a processing chamber, supplying a RF source power to form a plasma from the etching gas mixture, and etching the absorber layer through the patterned photoresist layer in the presence of the plasma.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method and apparatus for etching an absorber layer for manufacturing a photomask. More specifically, the invention relates to methods of etching of an absorber layer disposed on a photomask substrate with improved etching selectivity. In one embodiment, a particular gas mixture including at least a chlorine gas ($Cl_2$) and oxygen gas ($O_2$) with a certain predetermined flow rate ratio is utilized to etch a chromium containing layer to form a photomask. In another embodiment, another gas mixture including at least a $CHF_3$ and $CF_4$ with a certain predetermined flow rate ratio is utilized to etch a tantalum containing layer to form a photomask for EUV applications.

Figure 1:
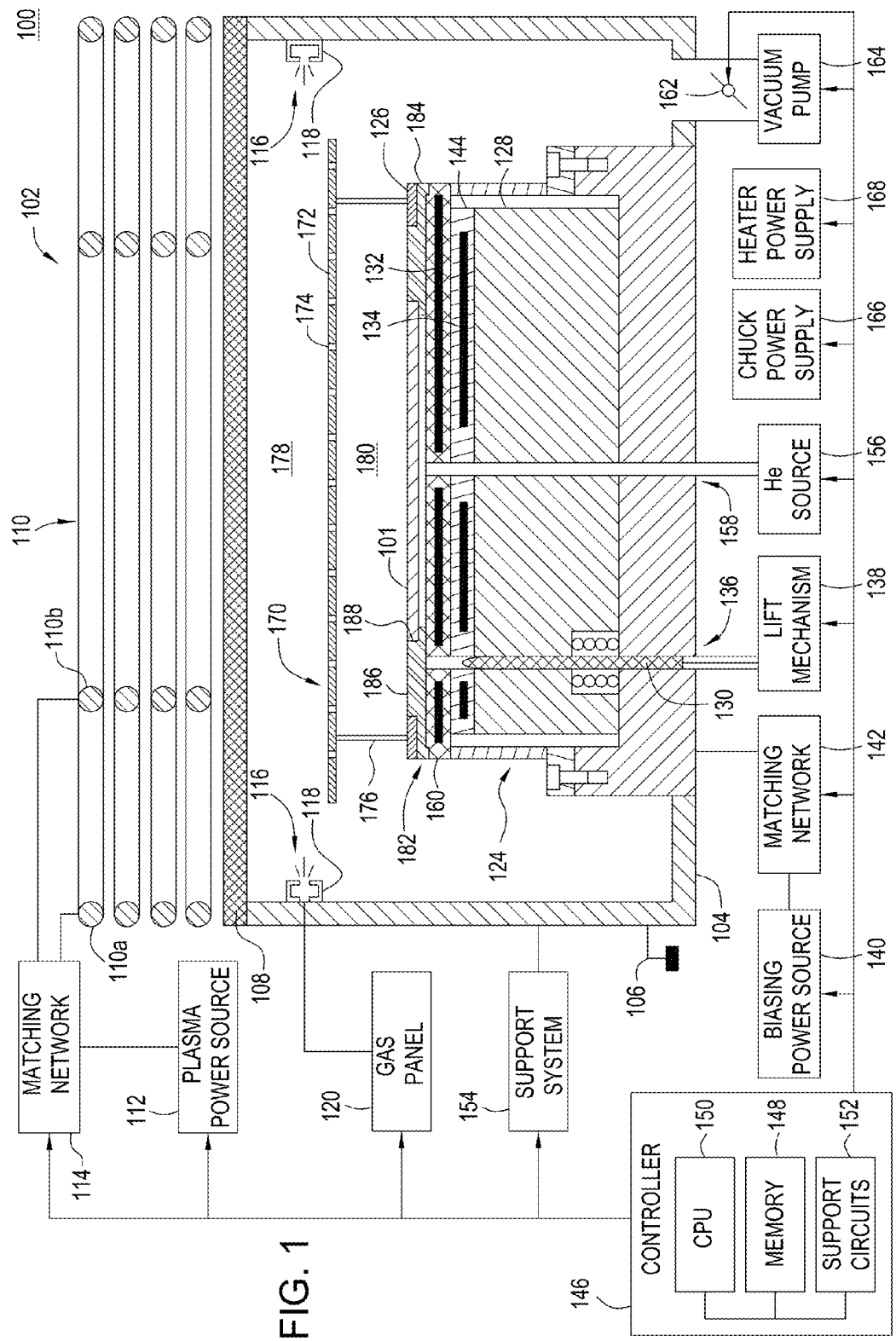
FIG. 1 depicts a schematic cross-sectional view of a processing chamber that may be utilized to fabricate a photomask in accordance with one embodiment of the present invention.

FIG. 1 depicts a schematic diagram of an etch reactor 100. Suitable reactors that may be adapted for use with the teachings disclosed herein include, for example, the Decoupled Plasma Source ($DP^S$®) II reactor, or the Tetra I, Tetra II, Tetra X Photomask etch systems, all of which are available from Applied Materials, Inc. of Santa Clara, Calif. The particular embodiment of the reactor 100 shown herein is provided for illustrative purposes and should not be used to limit the scope of the invention. It is contemplated that the invention may be utilized in other plasma processing chambers, including those from other manufacturers.

The reactor 100 generally comprises a process chamber 102 having a substrate pedestal 124 within a conductive body (wall) 104, and a controller 146. The chamber 102 has a substantially flat dielectric ceiling or lid 108. Other modifications of the chamber 102 may have other types of ceilings, e.g., a dome-shaped ceiling. An antenna 110 is disposed above the ceiling 108 and comprises one or more inductive coil elements that may be selectively controlled (two co-axial elements 110a and 110b are shown in FIG. 1). The antenna 110 is coupled through a first matching network 114 to a plasma power source 112, which is typically capable of producing up to about 3000 W at a tunable frequency in a range from about 50 kHz to about 13.56 MHz.

The substrate pedestal (cathode) 124 is coupled through a second matching network 142 to a biasing power source 140. The biasing source 140 generally is a source of up to about 500 W at a frequency of approximately 13.56 MHz that is capable of producing either continuous or pulsed power. Alternatively, the biasing source 140 may be a DC or pulsed DC source.

In one embodiment, the substrate support pedestal 124 optionally comprises an electrostatic chuck 160, which has at least one clamping electrode 132 and is controlled by a chuck power supply 166. In alternative embodiments, the substrate pedestal 124 may comprise substrate retention mechanisms such as a susceptor clamp ring, a mechanical chuck, and the like.

A reticle adapter 182 is used to secure the substrate (e.g., photomask or reticle), onto the substrate support pedestal 124. The reticle adapter 182 generally includes a lower portion 184 that covers an upper surface of the pedestal 124 (for example, the electrostatic chuck 160) and a top portion 186 having an opening 188 that is sized and shaped to hold the substrate 101. The opening 188 is generally substantially centered with respect to the pedestal 124. The adapter 182 is generally formed from a single piece of etch resistant, high temperature resistant material such as polyimide ceramic or quartz. An edge ring 126 may cover and/or secure the adapter 182 to the pedestal 124.

A lift mechanism 138 is used to lower or raise the adapter 182 and the substrate 101 onto or off of the substrate support pedestal 124. The lift mechanism 138 comprises a plurality of lift pins 130 (one lift pin is shown) that travel through respective guide holes 136.

A gas panel 120 is coupled to the processing chamber 102 to provide process and/or other gases to the interior of the processing chamber 102. In the embodiment depicted in FIG. 1, the gas panel 120 is coupled to one or more inlets 116 formed in a channel 118 in the sidewall 104 of the chamber 102. It is contemplated that the one or more inlets 116 may be provided in other locations, for example, in the ceiling 108 of the processing chamber 102.

In one embodiment, the gas panel 120 is adapted to provide fluorinated process gas through the inlets 116 and into the interior of the body of the processing chamber 102. During processing, a plasma is formed from the process gas and maintained through inductive coupling of power from the plasma power source 112. The plasma may alternatively be formed remotely or ignited by other methods. In one embodiment, the process gas provided from the gas panel 120 includes at least a fluorinated gas, chlorine, and a carbon containing gas, an oxygen gas, and an chlorine containing gas. Examples of fluorinated and carbon containing gases include $CHF_3$ and $CF_4$. Other fluorinated gases may include one or more of $C_2F$, $C_4F_6$, $C_3F_8$ and $C_5F_8$. Examples of the oxygen containing gas include $O_2$, $CO_2$, $CO$, $N_2O$, $NO_2$, $O_3$, $H_2O$, and the like. Examples of the chlorine containing gas include $HCl$, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

The pressure in the processing chamber 102 is controlled using a throttle valve 162 and a vacuum pump 164. The vacuum pump 164 and throttle valve 162 are capable of maintaining chamber pressures in the range of about 1 to about 20 mTorr. The temperature of the wall 104 may be controlled using liquid-containing conduits (not shown) that run through the wall 104. Typically, the chamber wall 104 is formed from a metal (e.g., aluminum, stainless steel, and the like) and is coupled to an electrical ground 106. The process chamber 102 also comprises conventional systems for process control, internal diagnostic, end point detection, and the like. Such systems are collectively shown as support systems 154.

In operation, the temperature of the substrate 101 is controlled by stabilizing the temperature of the substrate pedestal 124. In one embodiment, the substrate support pedestal 124 comprises a resistive heater 144 and a heat sink 128. The resistive heater 144 generally comprises at least one heating element 134 and is regulated by a heater power supply 168. A backside gas (e.g., helium (He)) from a gas source 156 is provided via a gas conduit 158 to channels that are formed in the pedestal surface under the substrate 101. The backside gas is used to facilitate heat transfer between the pedestal 124 and the substrate 101. During processing, the pedestal 124 may be heated by the embedded resistive heater 144 to a steady-state temperature, which in combination with the helium backside gas, facilitates uniform heating of the substrate 101. Using such thermal control, the substrate 101 may be maintained at a temperature between about 0 and 550 degrees Celsius.

An optional ion-radical shield 170 is disposed in the chamber 102 above the pedestal 124. The ion-radical shield 170 is electrically isolated from the chamber sidewalls 104 and the pedestal 124 such that no ground path from the plate to ground is provided. In other embodiments, the ion-radical shield 170 may be biased or electrically floating. One embodiment of the ion-radical shield 170 comprises a substantially flat plate 172 and a plurality of legs 176 supporting the plate 172. The plate 172, which may be made of a variety of materials compatible with process needs, comprises one or more openings (apertures) 174 that define a desired open area in the plate 172. This open area controls the amount of ions that pass from a plasma formed in an upper process volume 178 of the process chamber 102 to a lower process volume 180 located between the ion-radical shield 170 and the substrate 101. The greater the open area, the more ions can pass through the ion-radical shield 170. As such, the size of the apertures 174 controls the ion density in volume 180, and the shield 170 serves as an ion filter. The plate 172 may also comprise a screen or a mesh wherein the open area of the screen or mesh corresponds to the desired open area provided by apertures 174. Alternatively, a combination of a plate and screen or mesh may also be used.

During processing, a potential develops on the surface of the plate 172 as a result of electron bombardment from the plasma. The potential attracts ions from the plasma, effectively filtering them from the plasma, while allowing neutral species, e.g., radicals, to pass through the apertures 174 of the plate 172. Thus, by reducing the amount of ions through the ion-radical shield 170, etching of the mask by neutral species or radicals can proceed in a more controlled manner. This reduces erosion of the resist as well as sputtering of the resist onto the sidewalls of the patterned material layer, thus resulting in improved etch bias and critical dimension uniformity.

A controller 146 is coupled to the processing chamber 100 to control operation of the processing chamber 100. The controller 146 includes a central processing unit (CPU) 150, a memory 148, and a support circuit 152 utilized to control the process sequence and regulate the gas flows from the gas panel 120. The CPU 150 may be any form of general purpose computer processor that may be used in an industrial setting. The software routines can be stored in the memory 148, such as random access memory, read only memory, floppy, or hard disk drive, or other form of digital storage. The support circuit 152 is conventionally coupled to the CPU 150 and may include cache, clock circuits, input/output systems, power supplies, and the like. Bi-directional communications between the controller 146 and the various components of the processing system 100 are handled through numerous signal cables.

Figure 2:
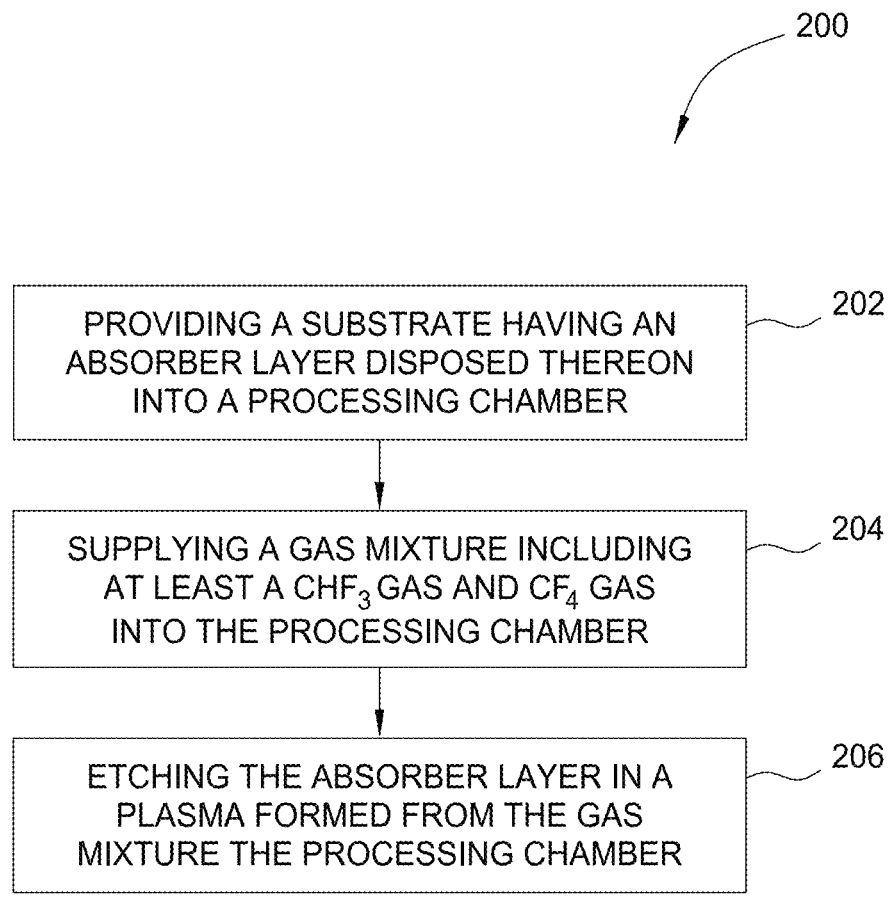
FIG. 2 depicts a flow diagram of a method for manufacturing a photomask in accordance with one embodiment of the present invention.
Figure 3A:
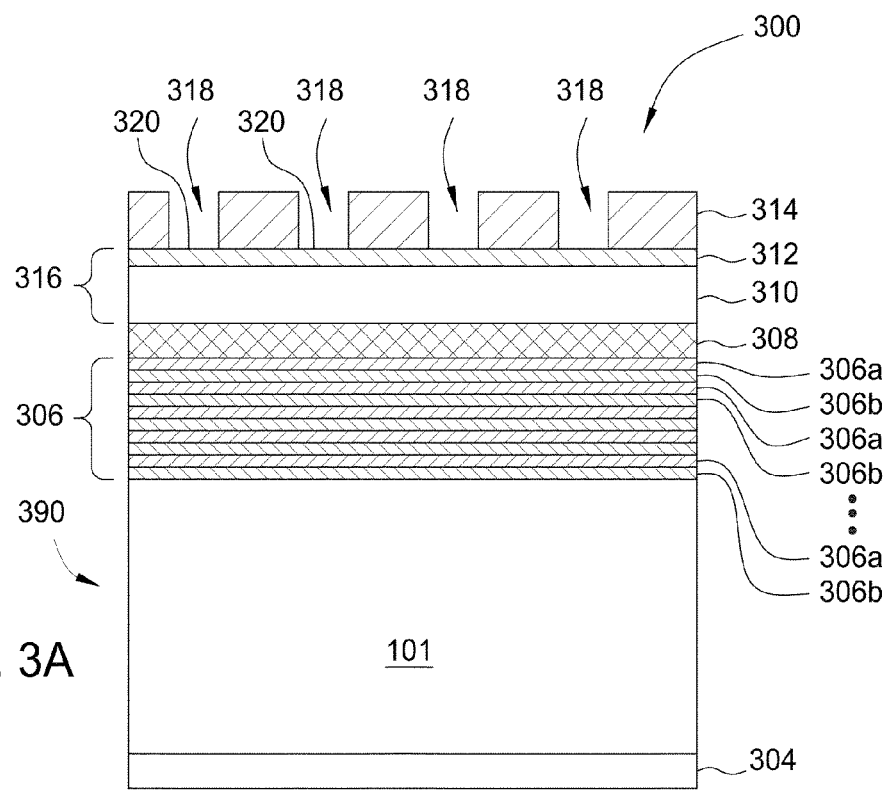
FIG. 3A-3B depict one embodiment of a sequence for manufacturing an EUV photomask in accordance with one embodiment of the invention.
Figure 3B:
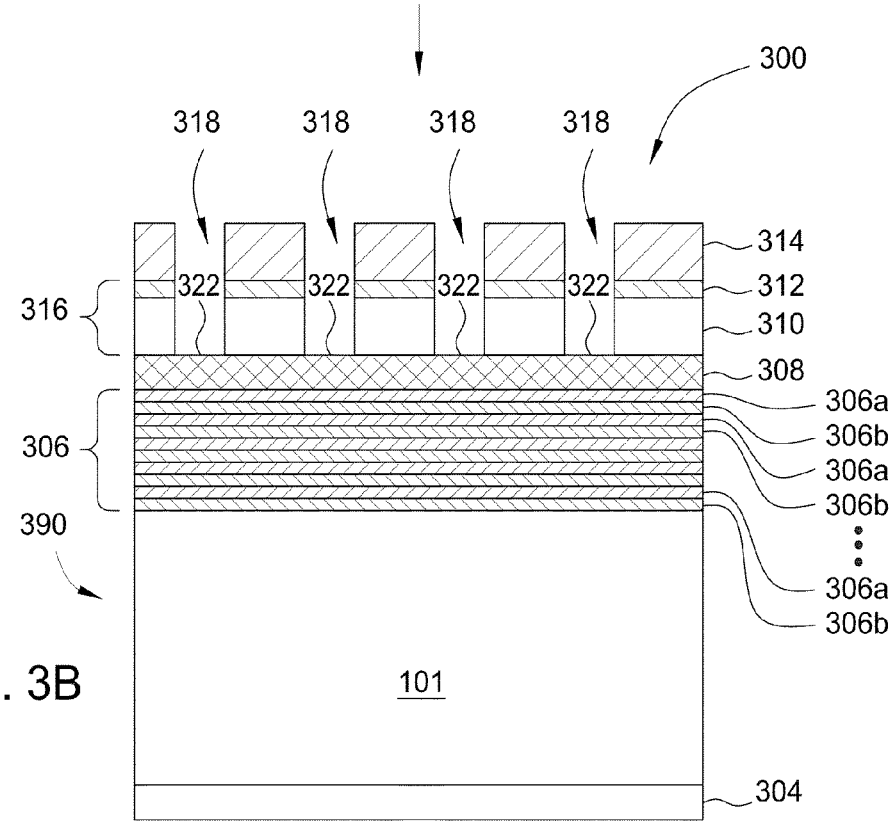

FIG. 2 is a flow diagram of one embodiment of a method 200 for etching an absorber layer formed in a film stack disposed on a photomask that may be performed in a processing chamber, such as the processing chamber 100 depicted in FIG. 1. FIGS. 3A-3B are schematic cross-sectional view illustrating a sequence for etching an absorber layer for manufacturing an EUV photomask according to the method 200. Although the method 200 is described below with reference to a substrate utilized to fabricate a photomask, the method 200 may also be used to advantage in other photomask etching or any etching applications.

The method 200, which may be stored in computer readable form in the memory 148 of the controller 146 or other storage medium, begins at block 202 when the photomask substrate 101 is transferred to and placed on a support pedestal 124 disposed in an etch reactor, such as the etch reactor 100 depicted in FIG. 1.

The method 200 begins at block 202 by providing a substrate into a processing chamber, such as the substrate 101 into the processing chamber 100 depicted in FIG. 1. The substrate 101 may be an optically transparent silicon based material, such as quartz (i.e., silicon dioxide ($SiO_2$)) layer, having a film stack 300 disposed on the substrate 101 that may be utilized to form desired features 318 in the film stack 300. As shown in the exemplary embodiment depicted in FIG. 3A, the substrate 101 may be a quartz substrate (i.e., low thermal expansion silicon dioxide ($SiO_2$)) layer. The substrate 101 may have a rectangular shape having sides between about 5 inches to about 9 inches in length. The substrate 101 may be between about 0.15 inches and about 0.25 inches thick. In one embodiment, the substrate 101 is about 0.25 inches thick. An optional chromium containing layer 304, such as a chromium nitride (CrN) layer may be disposed to a backside 302 of the substrate 101 as needed.

An EUV reflective multi-material layer 306 is disposed on the substrate 101. The reflective multi-material layer 306 may include at least one molybdenum layer 306*a* and at least one silicon layer 306*b*. Although the embodiment depicted in FIG. 3A shows five pairs of molybdenum layer 306*a* and a silicon layer 306*b* (alternating molybdenum layers 306*a* and the silicon layers 306*b* repeatedly formed on the substrate 101), it is noted that number of molybdenum layers 306*a* and the silicon layers 306*b* may be varied based on different process needs. In one particular embodiment, forty pairs of molybdenum layers 306*a* and the silicon layers 306*b* may be deposited to form the reflective multi-material layer 306. In one embodiment, the thickness of each single molybdenum layer 306*a* may be controlled at between about 1 Å and about 10 Å, such as about 3 Å, and the thickness of the each single silicon layer 306*b* may be controlled at between about 1 Å and about 10 Å, such as about 4 Å. The reflective multi-material layer 306 may have a total thickness between about 10 Å and about 500 Å. The reflective multi-material layer 306 may have an EUV light reflectivity of up to 70% at 13.5 nm wavelength. The reflective multi-material layer 306 may have a total thickness between about 70 nm and about 140 nm.

Subsequently, a capping layer 308 is disposed on the reflective multi-material layer 306. The capping layer 308 may be fabricated by a metallic material, such as ruthenium (Ru) material, zirconium (Zr) material, or any other suitable material. In the embodiment depicted in FIG. 3A, the capping layer 308 is a ruthenium (Ru) layer. The capping layer 308 may have a thickness between about 1 nm and about 10 nm.

An absorber layer 316 may then be disposed on the capping layer 308. The absorb layer 316 is an opaque and light-shielding layer configured to absorb a portion of the light generated during the lithography process. The absorber layer 316 may be in form of a single layer or a multi-layer structure, such as including a self-mask layer 312 disposed on a bulk absorber layer 310, as the embodiments depicted in FIGS. 3A-3B. In one embodiment, the absorber layer 316 has a total film thickness between about 50 nm and about 200 nm. The total thickness of the absorber layer 316 advantageously facilitates meeting the strict overall etch profile tolerance for EUV masks in sub-45 nm technology node applications.

In one embodiment, the bulk absorber layer 310 may comprise tantalum-based materials with essentially no oxygen, for example tantalum silicide based materials, such as TaSi or TaSiN, nitrogenized tantalum boride-based materials, such as TaBN, and tantalum nitride-based materials, such as TaN. The self-mask layer 312 may be fabricated from a tantalum and oxygen-based materials. The composition of the self-mask layer 312 corresponds to the composition of the bulk absorber layer 310 and may comprise oxidized and nitrogenized tantalum and silicon based materials, such as TaSiON, when the bulk absorber layer 310 comprises TaSi or TaSiN; tantalum boron oxide based materials, such as TaBO, when the bulk absorber layer 310 comprises TaBN; and oxidized and nitrogenized tantalum-based materials, such as TaON or TaO, when the bulk absorber layer 310 comprises TaN.

A patterned photoresist layer 314 is then formed over the absorber layer 316 having openings 318 formed therein that expose portions 320 of the absorber layer 316 for etching. The openings 318 of the photoresist layer 314 may be patterned by a gas mixture including at least a $H_2$ gas and a $N_2$ gas. During patterning of the photoresist layer 314, a RF source power may be supplied to a coil formed in a processing chamber, such as the etch reactor 100 which will be further described below with referenced to FIG. 1, with or without applying a bas RF power to etch thereof forming the openings 318 in the photoresist layer 314. The photoresist layer 314 may comprise any suitable photosensitive resist materials, such as an e-beam resist (for example, a chemically amplified resist (CAR)), and deposited and patterned in any suitable manner. The photoresist layer 314 may be deposited to a thickness between about 100 nm and about 1000 nm.

At block 204, an etching gas mixture is supplied into the etch reactor to etch the portions 320 of the absorber layer 316 exposed by the patterned photoresist layer 314, as shown in FIG. 3A. The self-mask layer 312 and the bulk absorber layer 310 included in the absorber layer 316 may be continuously etched using one process step, such as a single etchant chemistry, or separately etched by multiple steps in one or different etching processes as needed. The patterns from the photoresist layer 314 are then transferred into the absorber layer 316 through the etching process.

In one embodiment, the self-mask layer 312 and the bulk absorber layer 310 included in the absorber layer 316 may be continuously etched using one process step. The etching gas mixture supplied to etch the absorber layer 316 includes at least a fluorine containing gas. Suitable examples of the fluorine containing gas includes $CF_4$, $CHF_3$, $CH_2F_2$, $C_2F_6$, $C_2F_8$, $SF_6$, $NF_3$ and the like. As the fluorine element is an aggressive etchant, the fluorine containing gas supplied in the etching gas mixture is utilized to etch away portions of the absorber layer 316, including both the self-mask layer 312 and the bulk absorber layer 310 to form desired features 318 into the absorber layer 316. In one embodiment, the etching gas mixture supplied to etch the absorber layer 316 includes at least a $CF_4$ gas and a $CHF_3$ gas.

Additionally, a hydrocarbon gas may also be added to the etching gas mixture to assist etching the absorber layer 316 as needed. Examples of the hydrocarbon gas include $CH_4$, $C_2H_6$, $C_3H_8$, combinations thereof and the like. It is believed that hydrocarbon gas may provide a polymer source to assist passivating sidewalls of the features being etched during the etching process. In an alternative embodiment, an inert gas may also be supplied into the etching gas mixture to assist the profile control as needed. Examples of the inert gas supplied in the gas mixture include Ar, He, Ne, Kr, Xe or the like.

In one embodiment, $CF_4$ gas and $CHF_3$ gas supplied in the etching gas mixture may be maintained at a predetermined ratio to yield an efficient etching rate, along with the hydrocarbon gas as supplied, while sufficiently protecting the sidewall from undesired etching. In an exemplary embodiment, the $CHF_3$ gas and $CF_4$ gas is supplied in the etching gas mixture at a $CHF_3:CF_4$ ratio of greater than about 9, such as between about 10:1 and about 20:1. In another embodiment, $CF_4$ gas and $CHF_3$ gas is supplied in the etching gas mixture at a $CHF_3:CF_4$ between about 1:1 to about 10:1. Alternatively, $CF_4$ gas may be supplied at a flow rate by volume between about 1 sccm and about 100 sccm. $CHF_3$ gas may be supplied at a flow rate by volume between about 10 sccm and about 100 sccm.

Furthermore, the hydrocarbon supplied in the etching gas mixture may also be supplied at a predetermined ratio in the etching gas mixture to improve etching efficiency and performance. In on embodiment, the hydrocarbon gas, such as $CH_4$ gas, supplied in the total etching gas mixture may be between about 2 percent and about 20 percent. Alternatively, the hydrocarbon gas may be supplied at a flow rate by volume between about 1 sccm and about 40 sccm.

At block 306, after the etching gas mixture is supplied into the etching gas mixture, a RF power is supplied to form a plasma from the gas mixture therein to etch the absorber layer 316. The RF source power may be supplied at the gas mixture between about 100 Watts and about 3000 Watts and at a frequency between about 400 kHz and about 13.56 MHz. A bias power may also be supplied as needed. The bias power may be supplied at between about 10 Watts and about 300 Watts. In one embodiment, the RF source power may be pulsed with a duty cycle between about 10 to about 95 percent at a RF frequency between about 500 Hz and about 10 kHz.

Several process parameters may also be controlled while supplying the etching gas mixture to perform the etching process. The pressure of the processing chamber may be controlled at between about 0.5 milliTorr and about 500 milliTorr, such as between about 1 milliTorr and about 20 milliTorr.

The etching process is performed to etch the absorber layer 316 until an upper surface 322 of the underlying capping layer 308 is exposed, as shown in FIG. 3B. The end point of the etching process may be controlled by time mode or other suitable methods. For example, the etching process may be terminated after performing between about 50 seconds and about 500 seconds until the upper surface 322 of the underlying capping layer 308 is exposed. In this particular embodiment, the etching process may be performed between about 1 seconds and about 1000 seconds. In another embodiment, the etching process may be terminated by determination from an endpoint detector, such as an OES detector or other suitable detector as needed.

After the desired profile and/or the structure of the film stack 300 is formed on the substrate 101, the photoresist layer 314 may be removed. In one embodiment, the remaining resist and protective layer is removed by ashing. The removal process may be performed in-situ the etch reactor 100 in which the etching process performed at block 202-206 was performed. In the embodiment wherein the photoresist layer 314 is completely consumed during the etching process, the ashing or photoresist layer removal process may be eliminated.

Figure 4:
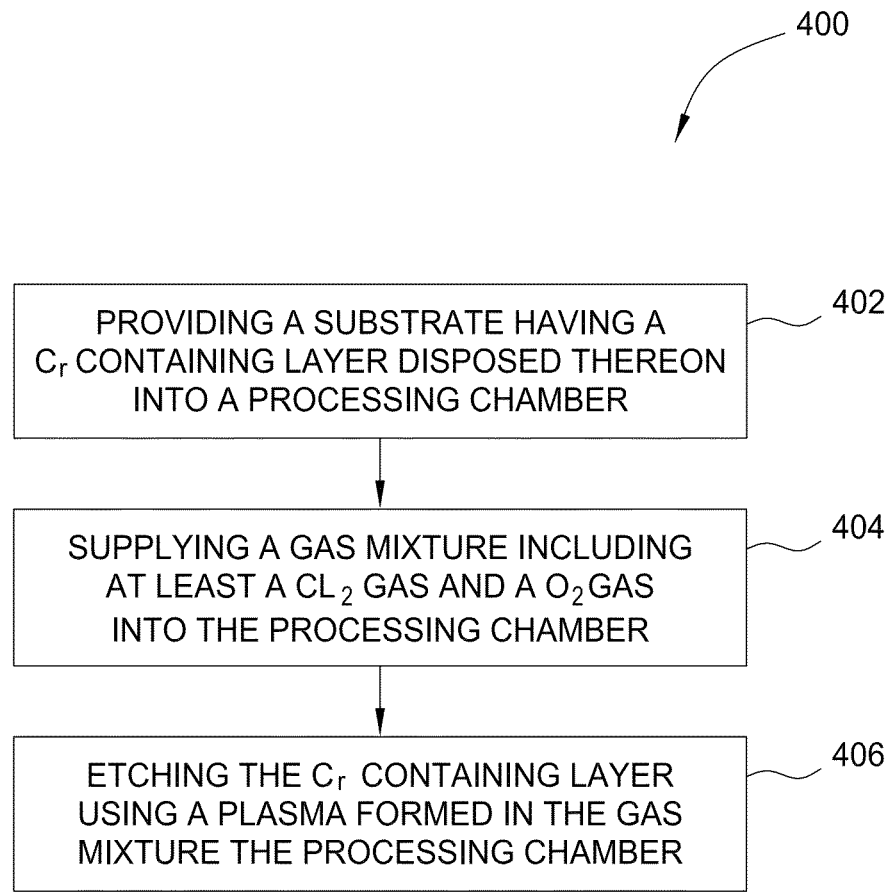
FIG. 4 depicts a flow diagram of a method for manufacturing a photomask in accordance with another embodiment of the present invention.
Figure 5A:
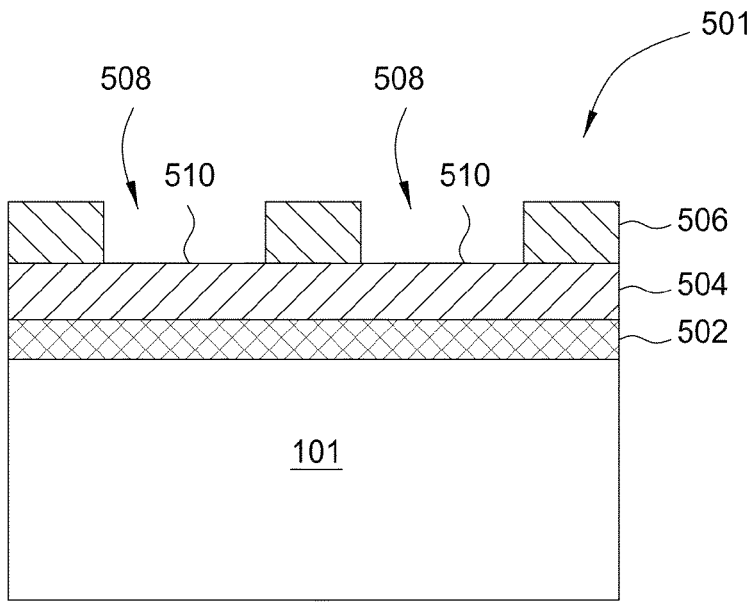
FIGS. 5A-5B depict one embodiment of a sequence for manufacturing a phase shift and binary photomask in accordance with one embodiment of the invention.

FIG. 4 is a flow diagram of one embodiment of a method 400 for etching an absorber layer formed in a film stack having a patterned photoresist layer disposed thereon on a photomask substrate, such as an absorber layer 504 formed in a film stack 501 having a patterned photoresist layer 506 disposed on the substrate 101 depicted in FIG. 5A.

Similar to the description above, the substrate 101 may be an optically transparent silicon based material, such as quartz (i.e., silicon dioxide ($SiO_2$)) layer. In the exemplary embodiment depicted in FIG. 5A, the substrate 101 may be a quartz substrate (i.e., low thermal expansion silicon dioxide ($SiO_2$)) layer. The substrate 101 has a rectangular shape having sides between about 5 inches to about 9 inches in length. The substrate 101 may be between about 0.15 inches and about 0.25 inches thick. In one embodiment, the substrate 101 is about 0.25 inches thick.

The film stack 501 disposed on the substrate 101 that may be utilized to form desired features (i.e., openings 508) in the film stack 501. Although the method 400 is described below with reference to a substrate utilized to fabricate a photomask, the method 400 may also be used to advantage in other photomask etching or any etching application.

The method 400 begins at block 402 when the substrate 101 is transferred to and placed on a substrate support member disposed in an etch reactor, such as the etching chamber 100 depicted in FIG. 1. The film stack 501 disposed on the substrate 101 includes an absorber layer 504 defined by the patterned photoresist layer 506 having portions 510 of the absorber layer 504 exposed by the patterned photoresist layer 506 readily for etching, as shown in FIG. 5A. In one embodiment, a phase shift mask layer 502 may be disposed between the substrate 101 and the absorber layer 504.

In one embodiment, the absorber layer 504 may be a metal containing layer, e.g., a chromium containing layer, such as a Cr metal, chromium oxide ($CrO_x$) chromium nitride (CrN) layer, chromium oxynitride (CrON), or multilayer with these materials, as needed. The phase shift mask layer 502 may be a molybdenum containing layer, such as Mo layer, MoSi layer, MoSiN, MoSiON, and the like. The patterned photoresist layer 506 is then formed over the absorber layer 504 having openings 508 formed therein that expose portions 510 of the absorber layer 504 for etching.

At block 404, an etching gas mixture is supplied into the processing chamber 100 to etch the absorber layer 504. The patterned photoresist layer 506 may serve as a mask layer to protect some portion of the absorber layer 504 from being etched during the absorber layer etching process.

In one embodiment, a chlorine containing gas may be supplied in the etching gas mixture used for etching an absorber layer (e.g., a chromium containing layer). Examples of the chlorine containing gas include HCl, $Cl_2$, $CCl_4$, $CHCl_3$, $CH_2Cl_2$, $CH_3Cl$, and the like. An oxygen containing gas may also supplied in the etching gas mixture during the etching process. Examples of the oxygen containing gas include $O_2$, $CO_2$, CO, $N_2O$, $NO_2$, $O_3$, $H_2O$, and the like. Alternatively, a hydrocarbon gas, such as $CH_4$, $C_2H_6$, $C_3H_8$, combinations thereof and the like, may also be supplied in the etching gas mixture as needed. It is believed that hydrocarbon gas may provide a polymer source to assist passivating sidewalls of the features being etched during the etching process. In an alternative embodiment, an inert gas may also be supplied into the etching gas mixture to assist the profile control as needed. Examples of the inert gas supplied in the gas mixture include Ar, He, Ne, Kr, Xe or the like.

In one embodiment, the etching gas mixture including $Cl_2$ and $O_2$ may be used to etch the absorber layer 504, such as a chromium containing layer. The $Cl_2$ gas and $O_2$ gas supplied in the etching gas mixture may be maintained at a predetermined ratio to yield an efficient etching rate, along with the hydrocarbon gas as supplied, while sufficiently protecting the sidewall from undesired etching. In an exemplary embodiment, the $Cl_2$ gas and $O_2$ gas is supplied in the etching gas mixture at a $Cl_2$:$O_2$ ratio greater than about 9, such as between about 10:1 and about 20:1. Alternatively, the $Cl_2$ gas may be supplied at a flow rate by volume between about 50 sccm and about 300 sccm. The $O_2$ gas may be supplied at a flow rate by volume between about 5 sccm and about 100 sccm.

Furthermore, the hydrocarbon supplied in the etching gas mixture may also be supplied at a predetermined ratio in the etching gas mixture to improve etching efficiency and performance. In on embodiment, the hydrocarbon gas, such as $CH_4$ gas, supplied in the total etching gas mixture may be controlled at between about 2 percent and about 20 percent at flow volume. Alternatively, the hydrocarbon gas may be supplied at a flow rate by volume between about 1 sccm and about 40 sccm.

At block 406, after the etching gas mixture is supplied into the etching gas mixture, RF power is supplied to form a plasma from the etching gas mixture therein to etch the absorber layer 504. The RF source power may be supplied at the gas mixture between about 100 Watts and about 3000 Watts and at a frequency between about 400 kHz and about 13.56 MHz. A bias power may also be supplied as needed. The bias power may be supplied at between about 10 Watts and about 300 Watts. In one embodiment, the RF source power may be pulsed with a duty cycle between about 10 to about 95 percent at a RF frequency between about 500 Hz and about 10 kHz.

Several process parameters may also be controlled while supplying the etching gas mixture to perform the etching process. The pressure of the processing chamber may be controlled at between about 0.5 milliTorr and about 500 milliTorr, such as between about 1 milliTorr and about 20 milliTorr.

Figure 5B:
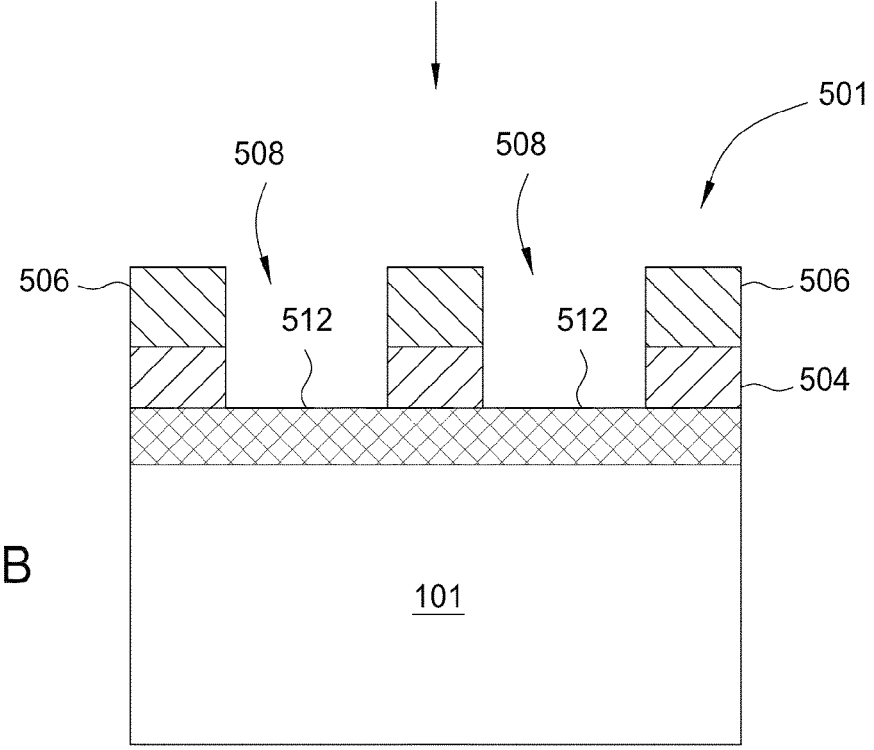

The etching process is performed to etch the absorber layer 504 until an upper surface 512 of the underlying phase shift mask layer 502 is exposed, as shown in FIG. 5B. The end point of the etching process may be controlled by time mode or other suitable methods. For example, the etching process may be terminated after performing between about 50 seconds and about 500 seconds until the upper surface 512 of the underlying phase shift mask layer 502 is exposed. In this particular embodiment, the etching process may be performed between about 1 seconds and about 500 seconds. In another embodiment, the etching process may be terminated by determination from an endpoint detector, such as an OES detector or other suitable detector as needed.

It is believed utilizing a predetermined ratio of reactive etchants supplied in an etching gas mixture may provide high selectivity for the absorber layer to the adjacent layers during an etching process. By efficiently improving etching selectivity of the absorber layer to other adjacent layers in the film stack, the photomask layer may sustain a longer time during an etching until completion of the features are transferred to the absorber layer so that the micro-loading effect may be efficiently eliminated or improved.

Thus, a method for etching an absorber layer, such as a Cr containing layer or a Ta containing layer has been provided that advantageously improves etching selectivity, trench attributes and profile over conventional processes. Accordingly, the method of etching an absorber layer described herein advantageously facilitates fabrication of photomasks suitable for patterning features having small critical dimensions in EUV technologies and phase shift and binary photomask applications.

While the foregoing is directed to embodiments of the present invention, other and further embodiments of the invention may be devised without departing from the basic scope thereof, and the scope thereof is determined by the claims that follow.

The invention claimed is:

1. A method of etching an absorber layer disposed on a photomask, comprising:
   transferring a film stack disposed on a substrate into an etching chamber, the film stack having a chromium containing layer partially exposed through a patterned photoresist layer;
   providing an etching gas mixture including $Cl_2$, $O_2$ and at least one hydrocarbon gas in to a processing chamber, wherein the $Cl_2$ and $O_2$ gases are supplied at a flow rate $Cl_2$:$O_2$ ratio between about 10:1 to 20:1 and the hydrocarbon gas is supplied between 2 percent and about 20 percent to the etching gas mixture by volume;
   supplying a RF source power to form a plasma from the etching gas mixture; and
   etching the chromium containing layer through the patterned photoresist layer in the presence of the plasma.

2. The method of claim 1, wherein a molybdenum containing layer is disposed between the chromium containing layer and the substrate.

3. The method of claim 2, wherein the molybdenum containing layer is at least one of a Mo layer, MoSi layer, MoSiN layer, and MoSiON layer.

4. The method of claim 1, wherein the chromium containing layer is at least one of a Cr metal, chromium oxide ($CrO_x$), chromium nitride (CrN) layer, and chromium oxynitride (CrON).

5. The method of claim 1, wherein the hydrocarbon gas is at least one of $CH_4$, $C_2H_6$, and $C_3H_8$.

6. The method of claim 1, wherein supplying the source RF power further comprises:
   providing a plasma source power of between about 100 to about 3000 Watts.

7. The method of claim 1, wherein supplying the RF power further comprises:
   providing a plasma bias power of between about 10 to about 300 Watts.

8. A method of etching an absorber layer disposed on a photomask, comprising:
   transferring a film stack disposed on a substrate into an etching chamber, the film stack having a chromium containing layer disposed on a molybdenum containing layer, wherein the chromium containing layer is partially exposed through a patterned photoresist layer;
   providing an etching gas mixture including $Cl_2$, $O_2$ and at least one hydrocarbon gas in to a processing chamber, wherein the $Cl_2$ and $O_2$ gases are supplied at a flow rate $Cl_2$:$O_2$ ratio between about 10:1 to 20:1 and the hydrocarbon gas is supplied between 2 percent and about 20 percent to the etching gas mixture by volume;
   supplying a RF source power to form a plasma from the etching gas mixture;
   providing a plasma bias power of between about 10 Watts and about 300 Watts; and
   etching the chromium containing layer through the patterned photoresist layer in the presence of the plasma.

* * * * *